United States Patent
Furuyama et al.

(10) Patent No.: US 6,643,758 B2
(45) Date of Patent: Nov. 4, 2003

(54) FLASH MEMORY CAPABLE OF CHANGING BANK CONFIGURATION

(75) Inventors: Takaaki Furuyama, Aichi (JP); Mitsuhiro Nagao, Aichi (JP)

(73) Assignee: Fujitsu Limited, Kawasaki (JP)

(*) Notice: Subject to any disclaimer, the term of this patent is extended or adjusted under 35 U.S.C. 154(b) by 158 days.

(21) Appl. No.: 09/984,357

(22) Filed: Oct. 30, 2001

(65) Prior Publication Data

US 2002/0161962 A1 Oct. 31, 2002

(30) Foreign Application Priority Data

Apr. 26, 2001 (JP) .................................. 2001-130416

(51) Int. Cl.[7] .............................................. G06F 12/00
(52) U.S. Cl. ..................... 711/203; 711/103; 711/156; 711/202
(58) Field of Search ....................... 711/103, 156, 711/203, 202

(56) References Cited

U.S. PATENT DOCUMENTS 6,557,054 B2 * 4/2003 Reisman ...................... 710/33

2002/0069317 A1 * 6/2002 Chow et al. .................. 711/104

FOREIGN PATENT DOCUMENTS

| JP | 06-131879 | 5/1994 |
| JP | 09-007390 | 10/1997 |

* cited by examiner

*Primary Examiner*—Reba I. Elmore
(74) *Attorney, Agent, or Firm*—Arent Fox Kintner Plotkin & Kahn, PLLC

(57) ABSTRACT

According to one aspect of the present invention, the flash memory comprises a memory region divided into a plurality of real banks, wherein from among the plurality of products which consists of a plurality of combinations of virtual banks having at least one real bank; and a combination of the top boot in which the most significant address is allocated to the boot bank having the boot sector and the bottom boot in which the least significant address is allocated to the boot bank, product information data are set in a product information record section, whereby any product can be configured.

15 Claims, 9 Drawing Sheets

FIG. 3

BNK-A

| | | | |
|---|---|---|---|
| SEC11 | SEC12 | SEC13 | SEC14 |
| ⋮ | SEC8 | SEC9 | SEC10 |

SEC0~7

BNK-B, C

| SEC20 | SEC21 | SEC22 | SEC23 |
|---|---|---|---|
| SEC16 | SEC17 | SEC18 | SEC19 |
| SEC12 | SEC13 | SEC14 | SEC15 |
| SEC8 | SEC9 | SEC10 | SEC11 |
| SEC4 | SEC5 | SEC6 | SEC7 |
| SEC0 | SEC1 | SEC2 | SEC3 |

BNK-D

| SEC4 | SEC5 | SEC6 | SEC7 |
|---|---|---|---|
| SEC0 | SEC1 | SEC2 | SEC3 |

FIG. 5

| BNK824 | DEVID | TBBLK (TBBLKB) | Product | |
|---|---|---|---|---|
| H | H | L (H) | 1 | 2 BANKs BOTTOM Boot (4MB/28MB) |
| H | H | H (L) | 2 | 2 BANKs TOP Boot (4MB/28MB) |
| H | L | L (H) | 3 | 2 BANKs BOTTOM Boot (8MB/24MB) |
| H | L | H (L) | 4 | 2 BANKs TOP Boot (8MB/24MB) |
| L | H | L (H) | 5 | 2 BANKs BOTTOM Boot (16MB/16MB) |
| L | H | H (L) | 6 | 2 BANKs TOP Boot (16MB/16MB) |
| L | L | L (H) | 7 | 4 BANKs BOTTOM Boot (4MB/4MB/12MB/12MB) |
| L | L | H (L) | 8 | 4 BANKs TOP Boot (4MB/4MB/12MB/12MB) |

Logic for A20

Logic for A19

Logic for A12~18

FIG. 8

|  | Input | | | | | | Output |
|---|---|---|---|---|---|---|---|
|  | /CE | /OE | /WE | A6 | A1 | A0 | DQ7-0 |
| Product 1 | L | L | H | VH | L | H | 01h |
| Product 2 | L | L | H | VH | L | H | 02h |
| Product 3 | L | L | H | VH | L | H | 03h |
| Product 4 | L | L | H | VH | L | H | 04h |
| Product 5 | L | L | H | VH | L | H | 05h |
| Product 6 | L | L | H | VH | L | H | 06h |
| Product 7 | L | L | H | VH | L | H | 07h |
| Product 8 | L | L | H | VH | L | H | 08h |

FLASH MEMORY CAPABLE OF CHANGING BANK CONFIGURATION

BACKGROUND OF THE INVENTION

1. Field of the Invention

The present invention relates to a flash memory capable of changing a plurality of bank configurations, and in particular to a flash memory which has a common memory circuit configuration, and which can change it into a 2-bank configuration or a 4-bank configuration by setting a product data.

2. Description of the Related Arts

A flash memory has a nonvolatile memory cell, and is erased and programmed in sector unit having a plurality of memory cells. An operation mode of the flash memory has a readout mode of reading stored data out, an erase mode of writing data "1" in all the memory cells in selected sectors, and a program mode of writing data "0" in the selected memory cell. The flash memory responds to a command write signal to be set to the erase mode or program mode.

As the flash memory is a nonvolatile memory which can hold memory data even in a state that a power supply is off, in many cases, it is utilized as a semiconductor memory which records a boot program which is accessed initially when the power supply is started. Accompanied by the condition, the flash memory is frequently configured by a bank having a boot sector which is accessed when the power supply is started, and a bank having the other normal sectors. In such a case, a bank configuration in response to a user's conveniences is demanded from a product that a capacitance of the bank having the boot sector is smaller than that of the other banks to a product that a capacitance of the former is equivalent to the latter.

Furthermore, in characteristic points of the flash memory, in the program mode or erase mode which is executed in response to the command write signal, a stress applying step of applying a fixed program pulse or erase pulse to the memory cell having a floating gate and a verifying step of checking a change of a threshold voltage of the memory cell after the stress pulses are repeatedly applied in a plurality of times. For this reason, the flash memory prohibits readout operations with respect to the bank during program or erase operations. In other words, when a sector in a certain bank is under the program or erase operations, even if the readout operation is for a memory cell of another sector in the bank, the readout operations are prohibited. Moreover, as the program or erase operations demand a longer time than the readout operations, once the program or erase operations are started with respect to a certain bank, a readable memory region is lessened so that the readout operations are limited to some extent. In other words, in the case where the flash memory has a 2-bank configuration, while one bank is under the program or erase operations, the other bank can carry out the readout operations, but such the one bank cannot carry them out.

Furthermore, in characteristic points of the flash memory, a top boot that an address of the bank having the boot sector is allocated to a most significant address and a bottom boot that the address is allocated to a least significant address are present. The top boot flash memory differs from the bottom boot flash memory in that, when the flash memory is mounted in a system, an access to the boot program in the flash memory is made according to the most significant address or the least significant address.

A conventional flash memory has generically a 2-bank configuration, but a product of a 4-bank configuration is being lately demanded in order to reduce a constraint of the readout operations. In other words, it is possible to decrease a capacitance of the memory which cannot be accessed due to under the program or erase operations, by increasing the number of banks.

Furthermore, even if having the 2-bank configuration, a plurality of products having various sizes in the capacitance of the bank having the boot sector as compared with the other banks are demanded.

However, it is not efficient either preferable in views of a production control to design and manufacture a plurality of the flash memories corresponding to the large number of products.

SUMMARY OF THE INVENTION

It is therefore an object of the present invention to provide the flash memory which is a common memory circuit, and which can comply with a desirable product by setting product data.

It is another object of the present invention to provide the flash memory which has different bank configurations, and which can cope with a plurality of products in which addresses allocated to the plurality of banks are different in order, respectively.

In order to attain the aforementioned objects, according to one aspect of the present invention, the flash memory comprises a memory region is divided into a plurality of real banks, wherein from among the plurality of products which consists of combinations of virtual banks having at least one real bank; and a combination of the top boot in which the most significant address is allocated to the boot bank having the boot sector and the bottom boot in which the least significant address is allocated to the boot bank, product information data are set in a product information record section, whereby any product can be configured.

According to the aforementioned aspect, in a preferred embodiment, the memory region in the flash memory has the plurality of real banks which have a memory cell array, a word driver and a column selection circuit, respectively. A bank busy detection circuits are provided in each real bank. The bank busy detection circuit records whether or not the corresponding real bank is under the program or erase operations, and generates a readout enabling signal which in response to a bank selecting signal at the time of readout, prohibits a readout if under the program or erase operations and enables to read out if not under the program or erase operations. The bank busy detection circuit, according to whether or not the other real banks belonging to the virtual bank set by the product data are under the program or erase operations, set the readout enabling signal into a prohibition or enable state.

An another aspect of the present invention provides a nonvolatile memory which can modify a configuration of a virtual bank having at least one real bank, comprising a plurality of real banks having a plurality of memory cells, respectively; a product information memory for storing product information data having the virtual bank configuration; an address transforming section for converting an address to be supplied into an internal address according to the product information data; and a bank busy detection circuit which is provided in each of the real banks, and generates a program/erase state signal designating whether or not the corresponding real bank is under the program or erase operations, and in response to a real bank selecting signal at the time of a readout, generates a readout enabling signal for instructing an enabling or prohibition of a readout of such the corresponding real bank in accordance with the program/erase state signal of the real bank belonging to the same virtual bank, wherein the real bank belonging to the virtual bank is configured to be modified in accordance with the product information data, and the bank busy detection circuit generates the readout enabling signal of prohibiting the readout when any one of the program/erase state signals of the real bank belonging to the virtual bank established according to the product information data is in a program or erase operations state.

Furthermore, in the preferred embodiment, a bank decoder is provided which decodes an internal address which is an address for selecting the real bank, and is formed by the address transforming circuit, and which generates a real bank selecting signal. The real bank selecting signal generated by the bank decoder is supplied to the bank busy detection circuit, which generates the readout enabling signal according to whether or not the real bank belonging to the same virtual bank is under the program or erase operations, according to the real bank selecting signal.

According to the above aspect, in the preferred embodiment, the flash memory comprises the address transforming circuit which converts a supplied address into the internal address, and such the address transforming circuit converts the address of the real bank corresponding to the boot bank into the most significant or least significant, according to the top boot or bottom boot set by the product data.

Furthermore, in the preferred embodiment, the product information record section has a nonvolatile memory cell, and in which the product information data is writable in the nonvolatile memory cell. Thus, with respect to the common memory circuit, the product information data is written into the nonvolatile memory cell in the product information record section after an end of a manufacturing process, so that it is possible to set as a desirable product from among the plurality of products. Accordingly, it is possible to facilitate the production control.

BRIEF DESCRIPTION OF THE DRAWINGS

The above and other objects, aspects, features and advantages of the present invention will become more apparent from the following detailed description when taken in conjunction with the accompanying drawings, in which:

FIG. 3 is a diagram showing a configurational example of the real bank;

FIG. 5 is a diagram showing a relation between product information data and the 8 products;

FIG. 8 is a diagram showing an output example of a product ID code; and

DESCRIPTION OF THE PREFERRED EMBODIMENTS

An embodiment of the present invention will now be described with reference to the drawings. However, the scope of protection of the present invention is not limited to the below embodiment, and extends the present invention mentioned in claims for a patent and its equivalents.

Figure 1:
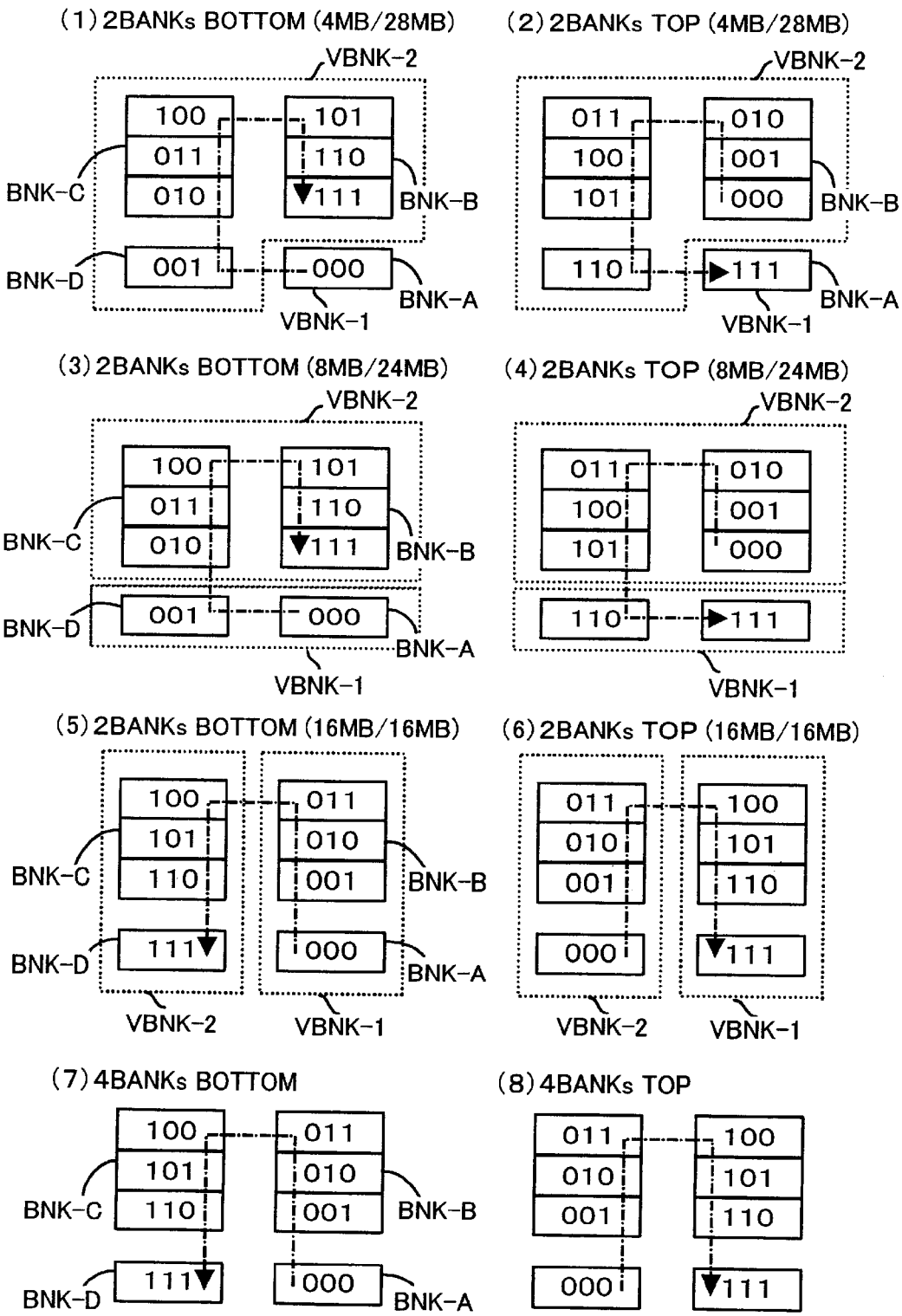
FIG. 1 is a diagram showing configurations of 8 kinds of product of a flash memory according to an embodiment of the present invention.

FIG. 1 is a diagram showing configurations of 8 kinds of product of a flash memory according to the embodiment of the present invention. The flash memory according to the embodiment of the present invention has a 32-MB capacitance, for example, and in which in all products, a memory region is configured by 4 real banks BNK-A to D, and their real banks includes 4-MB real bank BNK-A which has boot sectors (not shown); 12-MB real banks BNK-B, BNK-C; and a 4-MB real bank BNK-D. Furthermore, as products of the flash memory, a 2 bank product composed of two virtual banks and a 4 bank product composed of four virtual banks are present, and in FIG. 1,(1) to (6) show the 2 bank products and (7) and (8) show the 4 bank products.

Here, a real bank means a lump of a plurality of memory cells formed actually in the memory region, and has at least a word driver, a column selection circuit and a memory cell array, and is selected according to a real bank selecting signal obtained by decoding a bank selecting address. Also, a virtual bank means a bank formed by a single or plurality of real banks, and a hypothetical bank viewed from a system side mounting the memory circuit. And, generically, control of prohibiting an access to readout during program or erase operations is carried on in unit of the virtual bank.

Furthermore, as the products of the flash memory, in the 2-bank product, a product configured by the 4-MB and 28-MB virtual banks ((1) and (2) in FIG. 1), a product configured by the 8-MB and 24-MB virtual banks ((3) and (4) in FIG. 1), and a product configured by the 16-MB and 16-MB virtual banks ((5) and (6) in FIG. 1). Furthermore, the product of the flash memory has a bottom boot product in which the real bank BNK-A having a boot sector is allocated to a least significant address ((1), (3), (5) and (7) in FIG. 1) and a top boot product in which it is allocated to a least significant address ((2), (4), (6) and (8) in FIG. 1).

In a first 2-bank product (4 MB/28 MB) and the bottom boot product in (1) of FIG. 1, the real bank BNK-A having the boot sector is set as a first virtual bank VBNK-1 and the remaining real banks KBNK-B to D are set as a second virtual bank VBNK-2. In (1) of FIG. 1, a broken line indicates the virtual bank, and a solid line indicates the real bank. A least significant address "000" is allocated to the real bank BNK-A having the boot sector. In the order of addresses, as shown by a single-point chain line, the real bank BNK-A is the least significant address and its high order addresses are allocated sequentially to the real banks BNK-D, BNK-C and BNK-B.

In the first 2-bank product and the top boot product in (2) of FIG. 1, the configurations of the first and second virtual banks VBNK-1, VBNK-2 are same, but a most significant address "111" is allocated to the real bank BNK-A having the boot sector, and the order of the addresses is in an inverse direction, as shown by a single-point chain line.

In a second 2-bank product (8 MB/24 MB) and the bottom boot product in (3) of FIG. 1, the first virtual bank VBNK-1 is configured by the two real banks BNK-A, BNK-D, and the second virtual bank VBNK-2 is configured by the remaining real banks BNK-B, BNK-C. Similarly to the product of (1) in FIG. 1, the least significant address is allocated to the real bank BNK-A, and the order of addresses is created like a single-point chain line.

The second 2-bank product (8 MB/24 MB) and the top boot product of (4) in FIG. 1 have the same configurations of the virtual banks as(3)in FIG. 1, and the same address as (2) in FIG. 1 is allocated thereto.

In a third 2-bank product (16 MB/16 MB) and the bottom boot product in (5) of FIG. 1, the first virtual bank VBNK-1 is configured by the two real banks BNK-A, BNK-B, and the second virtual bank VBNK-2 is configured by the remaining real banks BNK-C, BNK-D. And, the least significant address is allocated to the real bank BNK-A, and in the order of addresses, the least significant address is allocated to the real bank BNK-A, and further the high order address is allocated in the order of the real banks BNK-B, BNK-C, BNK-D.

A fourth 2-bank product (16 MB/16 MB) and the top boot product in (6) of FIG. 1 have the same configurations of the virtual banks as in (5) of FIG. 1, and an address is allocated thereto inversely to each real bank.

In a 4-bank product and a bottom boot product in (7) of FIG. 1, the real bank agrees with the virtual bank. The least significant address is allocated to the real bank BNK-A, and the higher order addresses than that are allocated sequentially to the real banks BNK-B, BNK-C, BNK-D, as shown in a single-point chain line.

In the 4-bank product and the bottom boot product in (8) of FIG. 1, the real bank agrees with the virtual bank. The most significant address is allocated to the real bank BNK-A, and the lower order addresses than that are allocated sequentially to the real banks BNK-B, BNK-C, BNK-D, as shown in a single-point chain line. In other words, the order is inverse to the order of addresses in (7) of FIG. 1.

Figure 2:
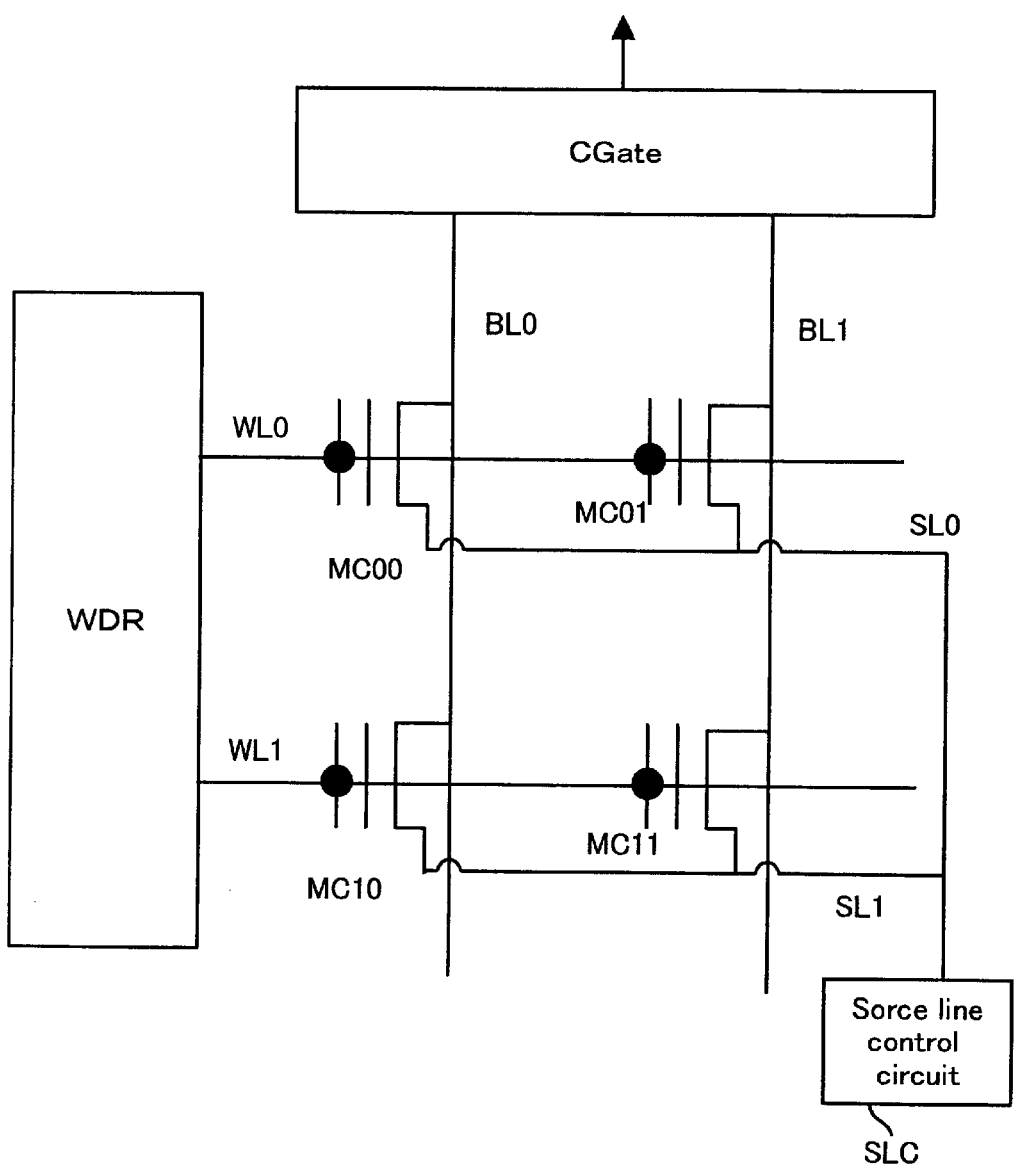
FIG. 2 is a diagram showing a configurational example of a real sector.

FIG. 2 is a diagram showing a configurational example of the real sector. In the real sector, memory cells MC00 to MC11 having a floating gate are stationed at a position where word lines WL0, WL1 intersect bit lines BL0, BL1, and a drain of each memory cell is connected to the bit lines BL0, BL1, and a source is connected to source lines SL0, SL1. The word line WL is driven by a word driver circuit WDR, and the bit line BL is connected to the exterior via a column gate CGate. The word line and the bit line are selected by a word decoder and a column decoder (not shown). Also, a source line SL is controlled by a source line control circuit SLC.

In an erase state, memory cell transistors are in a state that a threshold is low (data "1"), and at the time of program, the word line and the bit line are controlled to be at a high voltage, and the source line is controlled to be ground, whereby charges are injected into the floating gate, to raise a threshold voltage (data "0"). Also, at the time of erase, the bit line is controlled to be open, the word line to be negative voltage, and the source line to be at a high voltage, respectively, and charges in the floating gate are pulled out, to lower a threshold voltage. At the time of readout, an intermediate voltage of two threshold voltages is applied to the word line, and stored data are read out according to a magnitude of a current flowing in the bit line via memory cell depending on a threshold state.

FIG. 3 is a diagram showing a configuration of the real bank. The real bank BNK-A having the boot sector has sectors SEC0 to 7 having a relatively small capacitance and sectors SEC8 to 14 having a relatively large capacitance, as shown in FIG. 3. Contents to be accessed when a specified event occurs such as when a power supply is started, etc., for example, a boot program are recorded in the small sectors SEC0 to 7. Also, the real bank BNK-D not having the boot sector has sectors SEC0 to SEC7 having a relatively large capacitance, as shown in FIG. 3. Also, the real banks BNK-B, BNK-C have sectors SEC-0 to SEC-23 having a relatively large capacitance similarly to the real bank BNK-D, and the entire capacitance is increased to 12 MB. These sectors are a minimum unit of the program or erase operations, and the program or erase operations can be carried out in each sector, or a plurality of sectors can be programmed or erased simultaneously.

Figure 4:
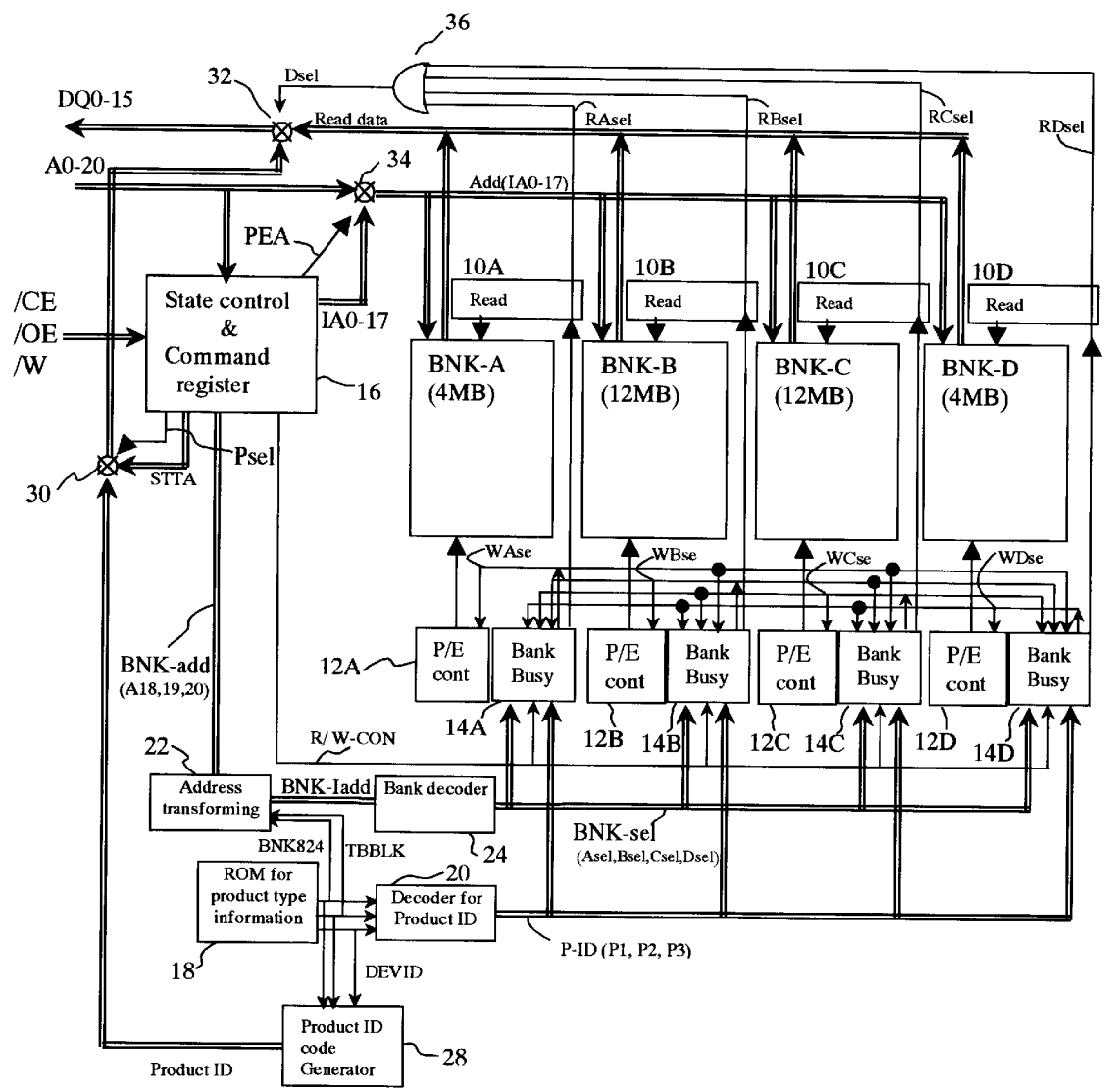
FIG. 4 is a configurational diagram of a memory circuit according to the embodiment of the present invention.

In turn, according to this embodiment, 8 kinds of product shown in FIG. 1 are realized by a common memory circuit. FIG. 4 is a configurational diagram of a memory circuit according to this embodiment. This memory circuit has, as explained in FIG. 1, the real bank BNK-A of capacitance 4 MB having the boot sector, the real banks BNK-B, BNK-C of capacitance 12 MB, and the real bank BNK-D of capacitance 4 MB. Each real bank has readout control circuits 10A to 10D for controlling readout operations, program/erase control circuits 12A to 12D for controlling the program and erase operations, and bank busy detection circuits 14A to 14D which store whether or not the real bank is under the program or erase operations, and when accessed along the readout operations, generates readout enabling signals RAsel to Rdsel designating whether or not a readout is enabled. Command signals /CE, /OE, /WE and address signals A0–20 supplied from the exterior are supplied to a state control and command register 16, to control readout operations, program operations and erase operations with respect to an internal circuit.

This memory circuit has a product information memory 18 in order to form a desirable product from among 8 products. This product information memory 18 has a 3-bit nonvolatile memory cell, and product information data BNK824, TBBLK, DEVID consisting of 3 bits are written thereto. The product is set to any product out of 8 products according to these 3-bit product information data. The nonvolatile memory cell integrated in the product information memory 18 is same as the memory cell shown in FIG. 2.

FIG. 5 is a diagram showing a relation between the product information data and the 8 products. As shown in FIG. 5, in the case where a top/bottom information data TBBLK as the product information data is in H level, set to a top boot product, and in case of L level, set to a bottom boot product. Also, 1 product is set out of 4 products obtained by adding a 4-bank product to 3 kinds of virtual bank configurational product of a 2-bank product, according to the other product information data BNK824, DEVID.

The memory circuit of FIG. 4 has further a product information decoder 20 which decodes the 2-bit product information data BNK824, DEVID, and outputs a product ID signal P-ID. The product information decoder 20 sets a first product signal P1 to H level with respect to the 2-bank product which groups the virtual bank into 4 MB and 28 MB, and sets a second product signal P2 to H level with respect to the 2-bank product which groups the virtual bank into 8 MB and 24 MB, and sets a third product signal P3 to H level with respect to the 2-bank product which groups the virtual bank into 16 MB and 16 MB, and sets all the product signals P1, P2, P3 to L level with respect to the 4-bank product.

Furthermore, addresses A0 to A20 are supplied from the exterior to the memory circuit. This addresses are configured by a bank selection address BNK-Add (A18, 19, 20) and inter-bank selection addresses A0 to A17. Incidentally, the bank selection address BNK-Add is strictly a block selection address in 4-MB unit shown in FIG. 1, and 8 blocks can be selected. Accordingly, a bank decoder 24 generates a bank selecting signal BNK-sel designating which real bank out of BNK-A to D is selected, in accordance with this bank selection address.

The bank decoder 24 decodes a bank selection internal address BNK=Iadd. For example, in case of the 2-bank product and the bottom boot product of (1) in FIG. 1, when a bank selection address BNK-add is "000," a bank selecting signal Asel selecting the real bank BNK-A is set to H level. Also, when the bank selection address BNK-add is "001," a bank selecting signal Dsel selecting the real bank BNK-D is set to H level. Furthermore, when the bank selection address BNK-add is "010," "011," or "100," a bank selecting signal Csel selecting the real bank BNK-C is set to H level. Also, when the bank selection address BNK-add is "101," "110," or "111," a bank selecting signal Bsel selecting the real bank BNK-B is set to H level. Even in case of the other products, as shown in FIG. 1.

As shown in FIG. 1, the address allocated to the real bank differs according to the product. As a relation between the bank decoder 24 and the bank selecting signal BNK-sel is fixed, an address transforming circuit 22 for converting the bank selecting address BNK-add from the exterior into the bank selecting internal address BNK-Iadd in each product is provided instead. This address transforming circuit 22 converts the bank selecting address BNK-add into the bank selecting internal address BNK-Iadd corresponding to the product information data BNK824, DEVID. This transforming circuit will be mentioned later.

According to this embodiment, a relation between the bank selecting internal address BNK-Iadd and the bank selecting signal BNK-sel in the bank decoder 24 is as shown in (5) or (7) of FIG. 1. In other words, when the bank selecting internal address BNK-Iadd is "000," the selecting signal Asel selecting the real bank BNK-A is set to H level, and when the bank selecting internal address BNK-Iadd is "001," "010," or "011," the selecting signal Bsel selecting the real bank BNK-B is set to H level, and when the bank selecting internal address BNK-Iadd is "100," "101," or "110," the selecting signal Csel selecting the real bank BNK-C is set to H level. And, when the bank selecting internal address BNK-Iadd is "111," the selecting signal Dsel selecting the real bank BNK-D is set to H level On the other hand, in the case of a top boot product where the top/bottom information data TBBLK is in H level, it is necessary that the bank selecting internal address to be supplied to the bank decoder 24 is converted into complement data by reversing the bank selection address from the exterior. This is conducted by the address transforming circuit 22.

Furthermore, in the case of the 2-bank product having the 4-MB/28-MB virtual bank ((1) and (2) of FIG. 1) and the 2-bank product having the 8-MB/24-MB virtual bank ((3) and (4) of FIG. 1 where the product information data BNK824 is set in H level, the order of addresses differs from the other products ((5) to (8)) of FIG. 1. Accordingly, an address conversion required therefor is conducted by the address transforming circuit 22.

When (1) and (5) of FIG. 1 are compared with each other, in the address A20, when a supply address is A19=1 or A18=1, an internal address IA20 is reverse data of the supply address A20, and when the supply address is A19=0 and A18=0, the internal address IA20 is non-reverse data of the supply address A20, preferably. Furthermore, in the address A19, when the supply address is A18=1, an internal address IA19 is reverse data of the supply address A19, and when the supply address is A18=0, the internal address IA19 is non-reverse data of the supply address A19, preferably. And, in the address A18, the internal address IA18 is the same as the supply address A18.

From the relation between the above supply address and internal address, in case of the bottom product and the order of addresses shown in (5) and (7) of FIG. 1, the address transforming circuit 22 can set the supply address to the internal address as it is. Also, in case of the top product and the order of addresses being same as shown in (6) and (8) of FIG. 1, a reversed address of the supply address is set to the internal address. On the other hand, in case of the bottom product and the order of addresses as shown in (1) and (3) of FIG. 1, it is necessary that, when the supply address is A19=1 or A18=1, the supply address is reversed. Inversely, in case of the top product and the order of addresses as shown in (2) and (4) of FIG. 1, it is necessary that, when the supply address is A19=0 and A18=0, the supply address is reversed.

Figure 6A:
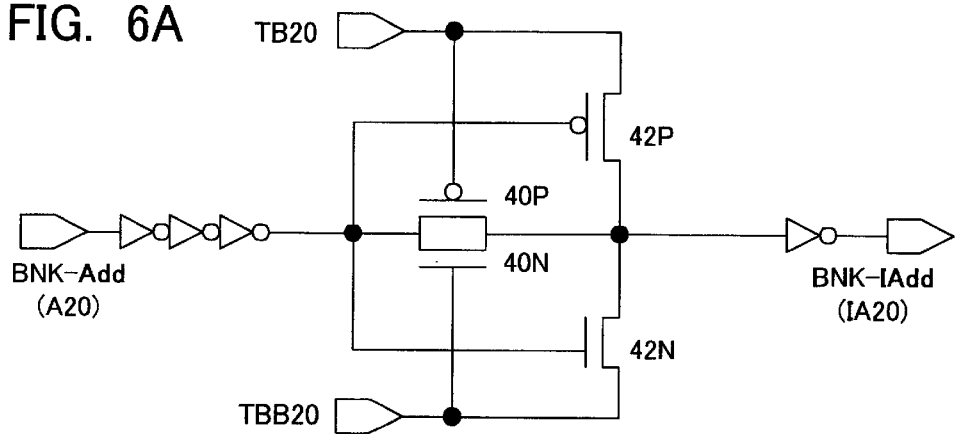
FIGS. 6A, 6B, 6C are diagrams showing an address transforming circuit.
Figure 6B:
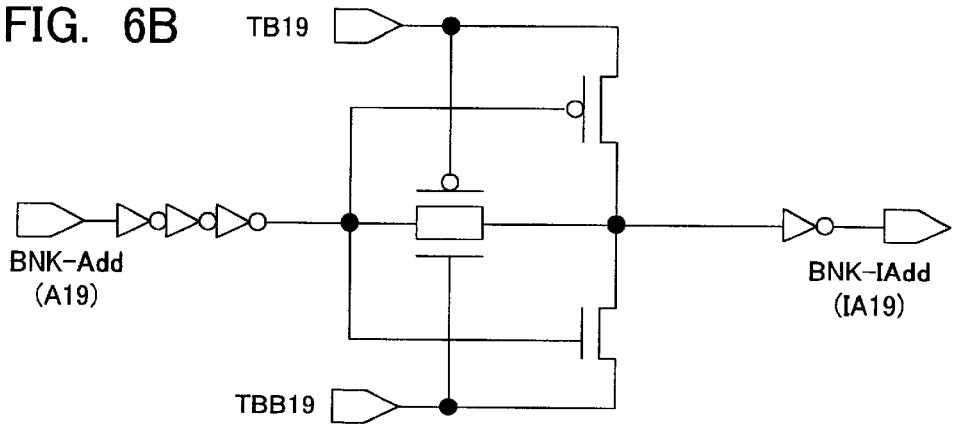
Figure 6C:
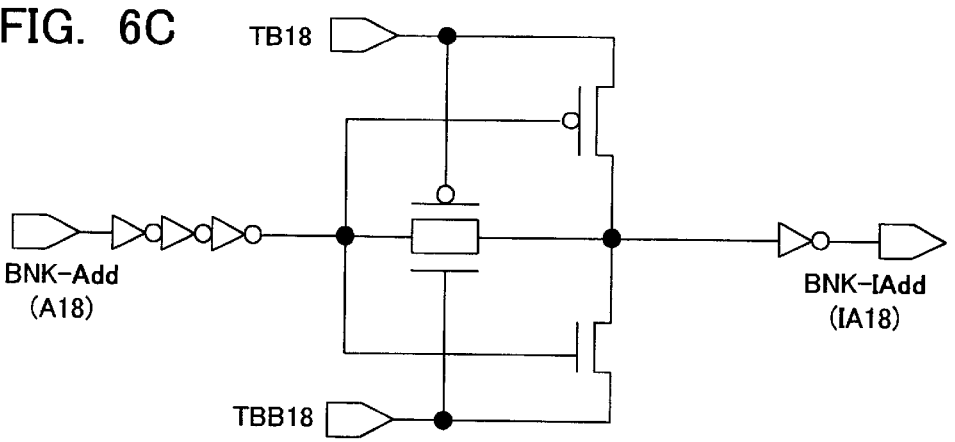

FIG. 6 and 7 are diagrams showing the address transforming circuit 22. FIG. 6 shows a transforming circuit of the same configuration. When conversion control signals TB20, TBB20 are in L and H levels, transfer gates 40P, 40N are conductive to form 4 stages of inverters configuration, and the supplied bank selection address BNK-add (A20) is still non-reverse, to be output as the bank selection internal address BNN-Iadd (IA20). Inversely, when the conversion control signals TB20, TBB20 are in H and L levels, the transfer gates 40P, 40N are non-conductive and an inverter composed of transistors 42P, 42N is added, and the supplied bank selection address BNK-add (A20) is reverse, to be output as the bank selection internal address BNN-Iadd (IA20).

FIG. 7 is a configurational diagram of a conversion control signal generation circuit in the address transforming circuit. As described above, when it is necessary to reverse the supply address, conversion control signals TB, TBB are TB=H and TBB=L, and when it is unnecessary to reverse the supply address, TB=L, TBB=H, preferably. The conversion control signal generation circuit of FIG. 7 is configured so as to satisfy the aforementioned conditions.

Figure 7A:
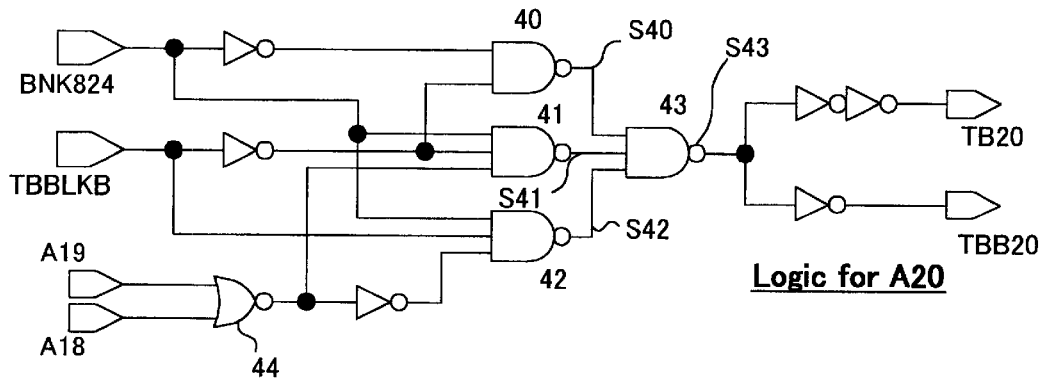
FIGS. 7A, 7B, 7C are diagrams showing the address transforming circuit.

First, the conversion control signal generation circuit in the address A20 is shown in FIG. 7A. The product information data BNK824, reverse data TBBLKB of the top/bottom information data, and the supply addresses A19, A18 are input to this circuit. In FIG. 7A, when an output S43 of a NAND gate 43 is in L level, non-reverse control signals TB20=H, TBB20=L are generated, and the internal address IA20 is the same as the supply address A20. Also, when the output S43 of the NAND gate 43 is in H level, reverse control signals TB20=L, TBB20=H are generated, and the internal address IA20 is a reversed address of the supply address A20.

The output S43 of the NAND gate 43 is set to H level in the case where outputs S40, S41, S32 of any one of NAND gates 40, 41, 42 in the previous stage are set to L level. First, in case of products 5, 7 of FIGS. 1 and 5, as a relation between the bank decoder 24 and the memory region is not changed, an output of any one of the NAND gates 40 to 42 is set to H level, and the output S43 of the NAND gate 43 is set to L level, to generate a non-reverse conversion control signal. Next, in case of products 6, 8, as the order of addresses is reverse to above, it is necessary to generate a reverse conversion control signal, and according to the product information data BNK824=L, TBBLKB=L, the output S40 of the NAND gate 40 is set to L level, and the output S43 of the gate 43 is set to H level.

Next, in case of products 1, 3, according to product information data BNK824=H, TBBLKB=H, when one of the supply addresses A19, A18 is set to the H level, the output S42 of the NAND gate 42 is set to L level, to generate the reverse conversion control signal. Also, in case of products 2, 4, according to the product information data BNK824=H, TBBLKB=L, when both of the supply addresses A19, A18 are set to the L level, the output S41 of the NAND gate 41 is set to L level, to generate the reverse conversion control signal.

Figure 7B:
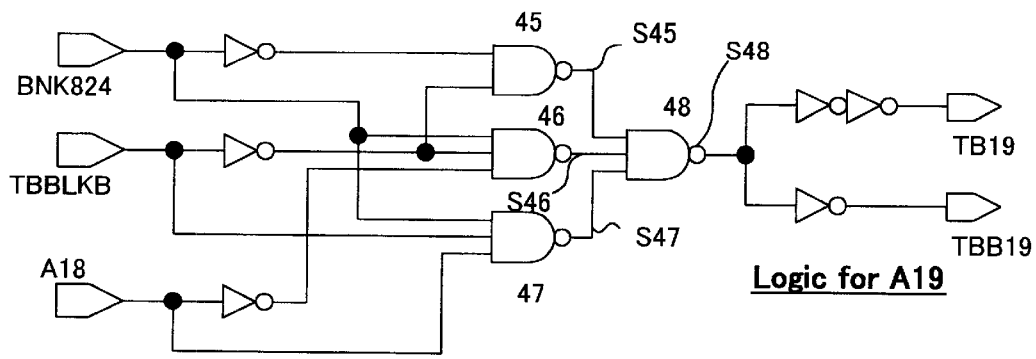

Next, the conversion control signal generation circuit in the address A19 is shown in FIG. 7B. The product information data BNK824, the reverse data TBBLKB of the top/bottom information data, and the supply address A18 are input to this circuit. In this case as well, in case of products 5, 7 of FIG. 1 and 5, the output of any one of the NAND gates 40 to 42 is also set to H level, and the output S48 of the NAND gate 48 is set to L level, to generate a non-reverse conversion control signal. Next, in case of products 6, 8, according to product information data BNK824=L, TBBLKB=L, the output S45 of the NAND gate 45 is set to L level, and the output S48 of the gate 48 is set to H level, to generate a reverse conversion control signal.

Next, in case of the products 1, 3, according to product information data BNK824=H, TBBLKB=H, when the supply address A18 is set to the H level, the output S47 of the NAND gate 47 is set to L level, to generate the reverse conversion control signal. Also, in case of the products 2, 4, according to the product information data BNK824=H, TBBLKB=L, when the supply address A18 is set to the L level, the output S46 of the NAND gate 46 is set to L level, to generate the reverse conversion control signal. These operations are simply reverse operations in case of the products 1, 3.

Figure 7C:
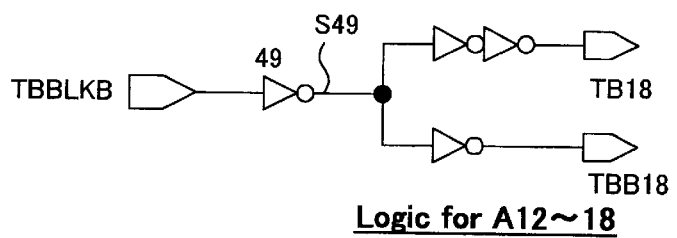

Finally, the conversion control signal generation circuit in the address A18 is shown in FIG. 7C. In this case, in case of the products 1, 3, 5, 7 as the bottom products simply, as the product information data is TBBLKB=H, an output S49 of an inverter 49 is set to L level, to generate the non-reverse conversion control signal. Inversely, in case of the products 2, 4, 6, 8 as the top products, as the product information data is TBBLKB=L, the output S49 of the inverter 49 is set to H level, to generate reverse conversion control signals TB18, TBB18.

Incidentally, in the remaining addresses A17 to A12 also, the similar conversion control signals are created, and the addresses only in case of the top products are reversed by the same transforming circuit as FIG. 6 provided in an address buffer (not shown).

Return to FIG. 4, the memory circuit can read out, from the exterior, which one of the 8 products is established. For this reason, a product ID code generation circuit 28 is provided. The product ID code generation circuit 28 decodes 3-bit product information data BNK824, TBBLK, DEVID recorded in the product information memory 18, and outputs a product ID code. The readout of this product ID code is instructed by a combination of commands /CE, /OE, /WE and addresses A0, A1, A6, and according to the control signal Psel from the state control circuit 16, a multiplexer is switched, to be output from an output terminal DQ7–0 via a multiplexer 32.

FIG. 8 is a diagram showing an output example of the product ID code. As an input, in the case where the combination of the commands /CE, /OE, /WE and the addresses A0, A1, A6 is L, L, H, VH, L, H, the ID code of the 8 products is output from the output DQ7–0. Incidentally, VH to be supplied to the address terminal A6 is a higher voltage which does not occur in normal operations.

Finally, it is necessary in the memory circuit of FIG. 4 that the bank busy detection circuits 14A to 14D generate the readout enabling signals RAsel to Rdsel according to the virtual bank of the set product. For this reason, in case of the 4-bank product, according to whether or not the corresponding real bank is under the program or erase operations, the bank busy detection circuits generate the readout enabling signal in response to the bank selecting signal BNK-sel at the time of readout. On the other hand, in case of the 2-bank product, according to whether or not the real bank belonging to the same virtual bank is under the program or erase operations, the bank busy detection circuits create the readout enabling signal. For this reason, corresponding to a product ID signal P-ID to be generated by the product ID decoder 20 in accordance with the established product information data, the bank busy detection circuit is configured so that the real bank to be referred to can be automatically changed.

For example, by reference to FIG. 1, since the real banks BNK-B, C, D belong to the same virtual bank in the products 1, 2, in accordance with data of the program or erase operations state held by the bank busy detection circuit corresponding to their real banks, each bank busy detection circuit generates the readout enabling signal. Since the real banks BNK-A, D belong to the same virtual bank in the products 3, 4, each bank busy detection circuit generates the readout enabling signal, similarly. In the real banks BNK-B, C, same. Furthermore, as in the products 5, 6, the real banks BNK-A, B belong to the same virtual bank and the real banks BNK-C, D belong to the same virtual bank, each bank busy detection circuit generates the readout enabling signal, similarly to above.

Figure 9:
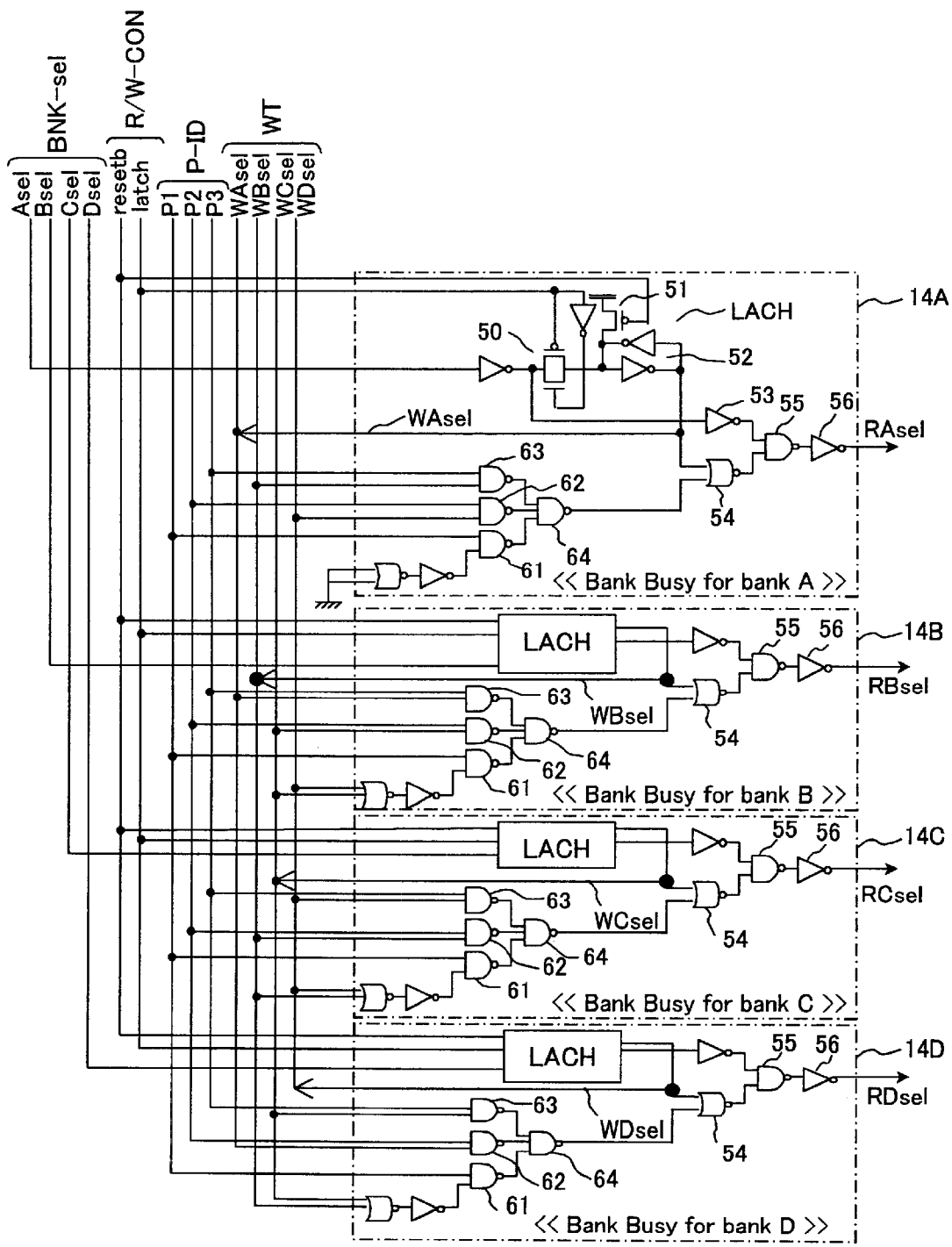
FIG. 9 is a circuit diagram of bank busy detection circuits 14A to 14D corresponding to the four real banks.

FIG. 9 is a circuit diagram of the bank busy detection circuits 14A to 14D corresponding to the four real banks. The bank selecting signals BNK-sel (Asel, Bsel, Csel, Dsel) to be generated by the bank decoder 24, write control signals R/W-CON (latch, resetb) to be generated when a command write is supplied, the product ID signals P-ID (P1, P2, P3) to be generated by the product ID decoder 20, and program/erase state signals WT (WAsel, WBsel, WCsel, WDsel) held by the respective bank busy detection circuit are input to each bank busy detection circuit 14A–14D.

A latch signal latch of the write control signal is set to L level when a command of commanding a program or erase is supplied by the command write, and a transfer gate 50 in the bank busy circuit 14A becomes conductive, and the bank selecting signal BNK-sel is latched in a latch circuit 52 comprising two inverters. Also, a reset signal resetb of the write control signal is set to L level when the program or erase is ended, and a P channel transfer gate 51 becomes conductive, and the latch circuit 52 is set to a reset state. A latch unit LATCH containing the latch circuit 52 is also provided in the other bank busy detection circuits 14B, 14C, 14D.

Accordingly, the output of the latch circuit 52 is supplied to the other bank busy detection circuits as the program/erase state signal WAsel designating that the real bank BNK-A is under the program or erase operations. Similarly, the program/erase state signals WBsel, WDsel are also supplied from the other bank busy detection circuits 14B, 14D to the bank busy detection circuit 14A.

And, in case of the products 3, 4, the second product ID signal P2 is set to H level, and by reference to the program/erase state signal WDsel of the real bank BNK-D via a NAND gate 62, a logical OR of WDsel with the own program/erase state signal WAsel is taken by a NOR gate 54 via a NAND gate 64, to generate the readout enabling signal RAsel. In other words, when any one of the real banks BNK-A, BNK-D belonging to the same virtual bank is under the program or erase operations, the readout enabling signal RAsel is set to L level, to prohibit a readout.

Furthermore, in case of the products 5, 6, the third product ID signal P3 is set to H level, to refer to the program/erase state signal WBsel of the real bank BNK-B via a NAND gate 63. In this case, when any one of the real banks BNK-A, BNK-B belonging to the same virtual bank is under the program or erase operations, the readout enabling signal RAsel is set to L level, to prohibit a readout.

Next, the bank busy detection circuit 14B of the real bank BNK-B will be explained, and the program/erase state signal WBsel designating that the own bank BNK-B is under program or erase operations is output from the latch unit LATCH. And, in case of the products 1, 2, the product ID signal P1 is set to H level, to refer to the program/erase state signals WCsel, WDsel of the banks BNK-C, D via the NAND gate 61. When the real banks BNK-B, C, D belonging to the same virtual bank are under the program/erase operations, the readout enabling signal RBsel is set to L level, to prohibit a readout.

In case of the products 3, 4 and in case of the products 5, 6, the same operations as the bank busy detection circuit 14A are conducted.

The bank busy detection circuit 14C of the real bank BNK-C and the bank busy detection circuit 14D of the real bank BNK-D have the same configuration, and by reference to the program/erase state signal of the real bank in the virtual bank combined according to the set product, via the NAND gates 61, 62, 63, the readout enabling signals RCsel, RDsel are generated, respectively.

Incidentally, in case of the products 7, 8, all the product ID signals P1, P2, P3 are set to L level, to not refer to the program/erase state signals of the other real banks.

As mentioned above, in the bank busy detection circuit, based on the product ID signals generated corresponding to settings of the product information data, the program/erase state signals of the other real banks to be referred to are automatically changed. Accordingly, when the combined virtual bank is under the program or erase operations, the readout operations into the real bank belonging to such the virtual bank are prohibited.

Return to the memory circuit of FIG. 4, an OR gate 36 takes logical OR of the readout enabling signals RAsel, RBsel, RCsel, RDsel. Accordingly, when all the readout enabling signals become L level which prohibits a readout, the readout control signal Dsel becomes L level, and a status signal STTA is output from a DQ terminal via the multiplexer 32 instead of readout data ("read data" in FIG. 4). The state control circuit 16 controls the program or erase operations with respect to the designated real bank in response to a program or erase command. Accordingly, as the state control circuit 16 recognizes which real bank is under the program or erase operations, it is possible to output the status signal STTA of the real bank selected in a readout.

Incidentally, the multiplexer 34 of FIG. 4 responds to a program/erase control signal PEA under the program or erase operations, and switches into the internal address IA0–17 generated by the state control circuit 16.

As explained above, the memory circuit according to this embodiment has a common circuit configuration, and can be modified to a configuration corresponding to the set product by setting the product information data. The plurality of products contain at least the 2-bank product and the 4-bank product, and the top boot product and the bottom boot product, and the 2-bank product has a first virtual bank containing the boot bank and a second virtual bank not containing the boot bank, and the plurality of kinds are present in combination of respective capacitances. The address of the real bank is changed in response to the established product information data. Also, the product ID signal is generated corresponding to the established product information data, and the bank busy detection circuit of each real bank generates a signal of prohibiting a readout when the real bank belonging to the same virtual bank is under the program or erase operations, corresponding to the product ID signal.

According to the aforementioned embodiment, the memory section 18 for storing the product information data and the product information decoder 20 for generating the product ID signal are separately provided, and by coalescing these, the product information signal to be supplied to the address transforming section 22 and the product information signal to be supplied to each bank busy detection circuit may be generated.

The present invention is not limited to 8 products, but the number of products may be greater or smaller than that. Also, the present invention is not limited to the 2-bank product and the 4-bank product, but the number of virtual banks may be further increased.

As mentioned above, according to the present invention, it is possible to provide the nonvolatile memory which can be set appropriately to the plurality of products consisting of a combination of the configuration of the virtual bank having the real bank, the configuration of the top boot or bottom boot, and the like.

What is claimed is:

1. A nonvolatile memory which can modify a configuration of a virtual bank having at least one real bank, comprising:

a plurality of real banks having a plurality of memory cells, respectively;

a product information memory for storing product information data having the virtual bank configuration;

an address transforming section for converting a supplied address into an internal address according to the product information data; and a bank busy detection circuit which is provided in each of the real banks, and generates a program/erase state signal designating whether or not a corresponding real bank is under the program or erase operations, and generates a readout enabling signal for instructing an enabling or prohibition of a readout of the corresponding real bank in accordance with the program/erase state signal of the real bank belonging to the same virtual bank in response to a real bank selecting signal at the time of a readout, wherein the real bank belonging to the virtual bank is configured to be modified in accordance with the product information data, and the bank busy detection circuit generates the readout enabling signal of prohibiting the readout when any one of the program/erase state signals of the real bank belonging to the virtual bank established according to the product information data is in a program or erase operations state.

2. The nonvolatile memory according to claim 1, wherein the product information data has top/bottom information data for distinguishing a top product and a bottom product, the top product or bottom product in which a real bank for a boot is assigned to a most significant address or a least significant address, the address transforming section reverses or non-reverses the supplied address in accordance to the top/bottom information data.

3. The nonvolatile memory according to claim 2, wherein
the real bank for the boot has a boot sector for storing a boot program to be accessed when a power supply is started.

4. The nonvolatile memory according to claim 1, wherein
the product information data has virtual bank information data for distinguishing a configuration of the real bank belonging to the virtual bank,
the address transforming section reverses or non-reverses the supplied address in accordance to the virtual bank information data.

5. The nonvolatile memory according to claim 1, wherein
the bank busy detection circuit has a latch unit which holds a program/erase state in receiving a real bank selecting signal when program or erase operations are stated, and which releases the held program/erase state when the program or erase operations are ended, and the program/erase state signal held by the latch unit is supplied to the bank busy detection circuit belonging to the other real banks.

6. The nonvolatile memory according to claim 5, wherein
the bank busy detection circuit, when both of the program/erase state signal of the own real bank and the program/erase state signal supplied from the bank busy circuits of the other real banks belonging to the same virtual bank do not indicate under the program or erase operations, generates a readout enabling signal for enabling a readout in response to a bank selecting signal at the time of the readout.

7. The nonvolatile memory according to claim 5, wherein
the bank busy detection circuit, when either the program/erase state signal of the own real bank or the program/erase state signal from the bank busy circuit of the other real banks belonging to the same virtual bank indicates under the program/erase operations, generates a readout enabling signal for prohibiting a readout in response to a bank selecting signal at the time of the readout.

8. The nonvolatile memory according to claim 1, further comprising:
a readout control circuit which is provided in each of the real banks,
wherein the readout control circuit executes readout control in response to the readout enabling signal generated by the bank busy detection circuit.

9. The nonvolatile memory according to claim 1, wherein
in the case where all the readout enabling signals generated by the bank busy detection circuits prohibit a readout, a state signal designating that the selected real bank is in the program or erase state is output externally.

10. The nonvolatile memory according to claim 1, wherein
product information set by the product information data are further output in response to a product information demand signal from the exterior.

11. A nonvolatile memory which can modify a configuration of a virtual bank having at least one real bank, comprising:
a plurality of real banks having a plurality of memory cells, respectively;
a product information memory for storing product information data having combinational information of a real bank configuration belonging to the virtual bank and a top boot and bottom boot configuration in which a boot real bank is assigned to a most significant or a least significant address;
an address transforming section for converting a supplied address into an internal address in accordance to the product information data; and
a bank busy detection circuit which is provided in each of the real banks, and generates a program/erase state signal designating whether or not a corresponding real bank is under the program or erase operations, and generates a readout enabling signal for instructing an enabling or prohibition of a readout of such the corresponding real bank in accordance with the program/erase state signal of the real bank belonging to the same virtual bank in response to a real bank selecting signal at the time of a readout, wherein
the real bank belonging to the virtual bank is configured to be modified in accordance with the product information data, and the bank busy detection circuit generates a readout enabling signal of prohibiting the readout when any one of the program/erase state signals of the real bank belonging to the virtual bank established in accordance to the product information data is in a program or erase operations state.

12. A nonvolatile memory which can modify a configuration of a virtual bank having at least one real bank, comprising:
a plurality of real banks having a plurality of memory cells, respectively;
a product information memory for storing product information data distinguishing a real bank configuration belonging to the virtual bank; and
a bank busy detection circuit which is provided in each of the real banks, and generates a program/erase state signal designating whether or not a corresponding real bank is under the program or erase operations, and generates a readout enabling signal for instructing an enabling or prohibition of a readout of the corresponding real bank in accordance with the program/erase state signal of the real bank belonging to the same virtual bank in response to a real bank selecting signal at the time of a readout, wherein
the real bank belonging to the virtual bank is configured to be modified in accordance with the product information data, and the bank busy detection circuit generates a readout enabling signal of prohibiting the readout when any one of the program/erase state signals of the real bank belonging to the virtual bank established in accordance to the product information data is in a program or erase operations state.

13. A nonvolatile memory which can modify a configuration of a virtual bank having at least one real bank, comprising:
a plurality of real banks having a plurality of memory cells, respectively;
a product information memory for storing product information data having a configuration of the real bank belonging to the virtual bank; and
an address transforming section for converting a supplied address into an internal address in accordance to the product information data, wherein
the address transforming section reverses or non-reverses the supplied address in response to the product information data.

14. A nonvolatile memory according to claim 13, wherein
the real bank contains a boot bank to be accessed when a power supply is started, the product information data are at least the number of virtual bank and data which distinguishes the real banks and boot banks belonging to respective virtual banks.

15. The nonvolatile memory according to claims 1 to 14, wherein the product information memory has a nonvolatile memory, and the product information data is stored in the nonvolatile memory.

* * * * *